(12) United States Patent
Wang et al.

(10) Patent No.: US 7,330,026 B2
(45) Date of Patent: Feb. 12, 2008

(54) METHOD AND APPARATUS FOR MAPPING AND CORRECTING GEOMETRIC DISTORTION IN MRI

(75) Inventors: Deming Wang, St. Lucia (AU); David Michael Doddrell, Westlake (AU)

(73) Assignee: The University of Queensland, Queensland (AU)

( * ) Notice: Subject to any disclaimer, the term of this patent is extended or adjusted under 35 U.S.C. 154(b) by 0 days.

(21) Appl. No.: 10/558,379

(22) PCT Filed: May 29, 2003

(86) PCT No.: PCT/AU03/00662

§ 371 (c)(1),
(2), (4) Date: Dec. 21, 2005

(87) PCT Pub. No.: WO2004/106962

PCT Pub. Date: Dec. 9, 2004

(65) Prior Publication Data

US 2007/0018645 A1    Jan. 25, 2007

(51) Int. Cl.
*G01V 3/00* (2006.01)

(52) U.S. Cl. .............................. 324/307; 324/318
(58) Field of Classification Search ............... 324/307, 324/318
See application file for complete search history.

(56) References Cited

U.S. PATENT DOCUMENTS

| | | | |
|---|---|---|---|
| 4,644,276 A * | 2/1987 | Sierocuk et al. ............ | 324/307 |
| 4,816,762 A * | 3/1989 | Bohning ..................... | 324/300 |
| 4,888,555 A * | 12/1989 | Vaughan et al. ............ | 324/318 |
| 5,005,578 A | 4/1991 | Greer et al. | |
| 5,498,963 A * | 3/1996 | Schneider et al. .......... | 324/309 |
| 5,545,995 A | 8/1996 | Schneider et al. | |
| 5,872,829 A | 2/1999 | Wischmann et al. | |
| 6,445,182 B1 | 9/2002 | Dean et al. | |
| 2006/0259282 A1* | 11/2006 | Failla et al. .................. | 703/2 |

FOREIGN PATENT DOCUMENTS

| | | |
|---|---|---|
| EP | 0 278 549 | 8/1988 |
| JP | 2152441 | 6/1990 |

OTHER PUBLICATIONS

Finnigan et al, "Phantom System to quantify and map gradient induced distortions in MR images of the Pelvis" Proceedings of the International Society for Magnetic Resonance in Medicine, p. 1688 Apr. 1, 2000, XP002405582 Denver, Co.

Breeuwer et al, "Detection and correction of geometric distortion in 3D MR images," Proceedings of the SPIE, vol. 4322 (2001) pp. 1110-1120, XP-002376927.

(Continued)

*Primary Examiner*—Brij Shrivastav
*Assistant Examiner*—Megann E Vaughn
(74) *Attorney, Agent, or Firm*—Nixon & Vanderhye P.C.

(57) ABSTRACT

A three-dimensional grid (10) is used as a phantom for mapping geometric distortion in magnetic resonance imaging (MRI) apparatus. This phantom provides an array of densely distributed control points in three-dimensional space. These points are each defined by three orthogonal planes. In the phantom image, the planes are determined by detecting boundary surfaces between portions of the phantom and its surrounding medium, enabling the positions of the control points to be measured to sub-voxel accuracy. The mapped distortion can then be used to automatically correct images produced by the MRI apparatus.

13 Claims, 15 Drawing Sheets

OTHER PUBLICATIONS

Price et al, "Quality assurance methods and phantoms for magnetic resonance imaging: Report of AAPM nuclear magnetic resonance Task Group No. 1a," Medical Physics, AIP, Melville, NY, vol. 17, No. 2, Mar. 1, 1990, pp. 287-295, XP 000114577.

Wang et al, "A novel phantom and method for comprehensive 3-dimensional measurement and correction of geometric distortion in magnetic resonance imaging," Magnetic Resonance Imaging, vol. 22, No. 4 (2004), pp. 529-542, XP002405583.

* cited by examiner

Fig. 6

METHOD AND APPARATUS FOR MAPPING AND CORRECTING GEOMETRIC DISTORTION IN MRI

This application is the US national phase of international application PCT/AU2003/000662 filed May 29, 2003 which designated the U.S., the entire content of which is hereby incorporated by reference.

This invention relates to method and apparatus for mapping and/or correcting geometric distortion in magnetic resonance imaging (MRI). In particular, the invention is directed to the use of a three dimensional model or "phantom" to map distortion.

BACKGROUND ART

MRI has revolutionized diagnostic imaging over the past two decades. This imaging modality can explore the physical properties of tissue in great detail and is arguably the most powerful imaging technique in the current practice of radiology, especially for imaging of the brain. MRI has become a valuable radiological technique for both structural and functional study of the brain. MRI is also widely used in nearly every aspect of radiological examinations and it is gradually replacing other imaging modalities.

However, MRI does have some limitations. Its constraints are related to the homogeneity of the field generating devices used to form the image. Geometric distortion arising from magnetic field inhomogeneity and gradient field non-linearity has been one of the major concerns. The current generation of MRI scanners has been designed with gradient rise times of less than 200 μs. In order to achieve such short rise times, gradient designers have restricted the length of the gradient coils and also used fewer turns. Such restrictions have led to an increase in the gradient field non-linearity, the result being image distortions. Although slight distortions in MR images normally have little consequences in routine radiological examinations, geometric distortion can be a serious problem in certain MRI applications where high geometric accuracy is required. Examples where precision is a primary consideration include image-guided surgery, and volumetric quantification.

Geometric distortion arising from the static field inhomogeneity and gradient field non-linearity has been studied by using specially designed models, hereafter referred to as "phantoms" to establish control points. Nearly all of these phantoms, however, have been designed for two dimensional (2D) measurements. Two major design approaches have been employed, one using square grids, and the other using cylindrical rods or capillary tubes. A common feature in both design approaches is that the control points are defined only through the intersection of the imaging slice with the grids or cylindrical rods. A clear limitation in these approaches is that only the two coordinates of the each control point's location in the imaging plane can be measured. The third coordinate (that is perpendicular to the imaging plane) is immeasurable and is unknown. Therefore, the measurement of geometric distortion with 2D phantoms only provides an incomplete description of the image distortion. In addition to this serious limitation, mapping geometric distortion in the entire imaging volume using 2D phantoms is time consuming. It often requires measurements with the phantom positioned at different locations and with different orientations. Additional errors can easily be introduced in the process of repositioning.

For a complete mapping of geometric distortion in MRI, control points defined in 3D are required. One previous study [1,2] which used control points defined in 3D to study geometric distortion used spheres of a certain size arranged in three dimensions. In order to specify the positions of the control points, the centre of the gravity of the spheres was used to generate the control points' positions. To ensure accuracy, such an approach requires the spheres to have a sufficient size. This requirement puts a limit on the number of spheres that can be arranged in a phantom. In the earlier study, spheres of 11 mm in diameter were used, and two phantoms were constructed that contained 427 and 793 control points, respectively. The accuracy associated with the positional measurement of the control points appeared to be dependent on a number of factors including the size of the image voxels.

This approach of using "point-like" objects, i.e. spheres, to define a point in space therefore has limitations, particularly on the number of control points that can be introduced.

There are two main requirements for comprehensive and accurate mapping of geometric distortion in 3D. First, the number of sampling points (control points) needs to be large enough to provide a comprehensive mapping of the spatial variations of the distortion. Dense sampling is necessary if detailed spatial information on local deformations is to be obtained. Secondly, the positions of the sampling or control points must be measured with accuracy, as this accuracy ultimately determines the spatial quantification of the geometric distortion.

It is an aim of this invention to provide an improved method and apparatus for mapping geometric distortion in imaging applications, such as MRI. The mapped distortion can then be used to correct acquired images.

SUMMARY OF THE INVENTION

In one broad form, this invention provides apparatus for use in measuring distortion in an imaging system, the apparatus comprising a three-dimensional structure having a plurality of boundary surface portions, the structure defining a plurality of control points thereon which are of constant spatial relationship to each other, each of the control points being definable by reference to three orthogonal planes, each of which is identifiable by reference to one or more of the boundary surface portions of the structure, wherein in an image of the apparatus produced by the imaging system, the position of each of said planes for each control point is determinable by detecting in the image the interfacial boundary between the respective boundary surface portion(s) and a medium surrounding the structure.

In a preferred embodiment, the structure comprises a plurality of spaced parallel planar grids, each grid having opposed planar boundary surface portions. Each grid is formed by a plurality of spaced parallel first slat-like portions and a plurality of spaced parallel second slat-like portions orientated orthogonally to the first slat-like portions and intersecting therewith, each of the slat-like portions having opposed boundary surface portions orthogonal to the plane of the grid. Each control point is located on a boundary surface of a grid at the intersection of one of the first slat-like portions with one of the second slat-like portions. Each control point is defined by the intersection of (a) the plane of the boundary surface of the grid on which it is located,
(b) a plane in the middle of the opposed boundary surface portions of the respective first slat-like portion, and
(c) a plane in the middle of the opposed boundary surface portions of the respective second slat-like portion.

The three dimensional structure serves as a phantom which allows a large number of control points to be obtained, each control point being defined by three orthogonal planes.

In another form, the invention provides a method of determining geometric distortion in an imaging system, comprising the steps of (a) providing a three-dimensional structure as described above, (b) creating an image of the structure using the imaging system, (c) locating the positions of the control points of interest in the image, and (d) for each control point of interest, calculating the difference between the position of the control point in the image and the true position of the control point.

Typically, in step (c) the image position of each control point of interest is located by reference to its associated boundary surfaces. Step (c) therefore includes, for each control point of interest, detecting an interfacial boundary between each of the associated boundary surface portions and a medium surrounding the structure, determining the three orthogonal planes by reference to the detected boundary surfaces, and locating the image position of the control point as the intersection of the three determined orthogonal planes.

Preferably, the step of detecting an interfacial boundary comprises image edge detection using a derivative function, such as a Prewitt operator.

Advantageously, step (c) also includes the preliminary step of convoluting the image with a mask to enhance the prominence of the voxels at the control points.

The calculated three-dimensional distortion map, i.e. the differences between the image positions and true positions of the control points, can then be applied to modify the imaging system so as to compensate for geometric distortion.

In order that the invention may be more fully understood and put into practice, a preferred embodiment thereof will now be described by way of example, with reference to the accompanying drawings.

BRIEF DESCRIPTION OF THE DRAWINGS

FIG. 6 is a 2D mask used in a convolution for enhancement of the prominence of the voxels at the crosses in the derivative images.

DESCRIPTION OF PREFERRED EMBODIMENT

Figure 2:
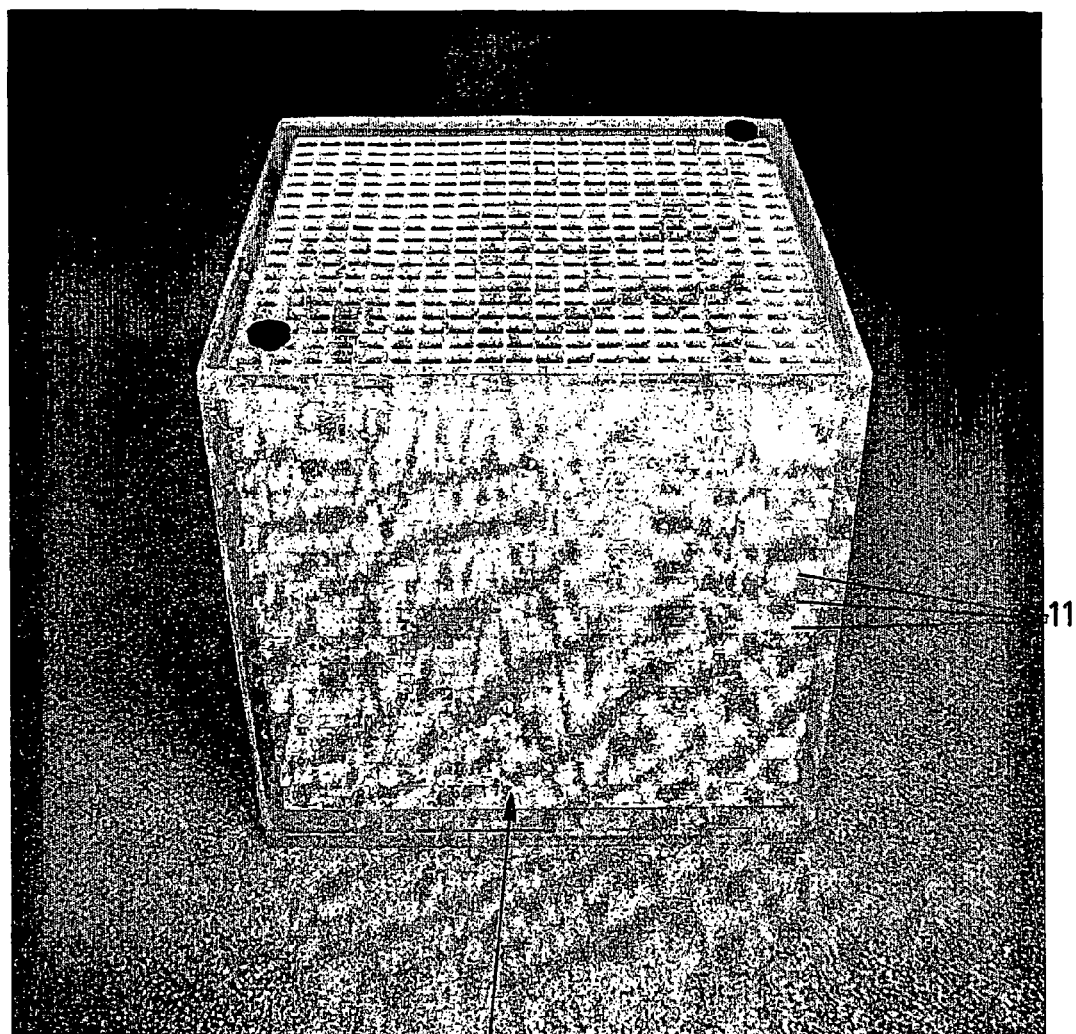
FIG. 2 is a photographic representation of a 3D phantom according to one embodiment of the invention, with the coordinate axis system used in relating to the orientation of the phantom being shown in the bottom left corner.

A 3D phantom 10 according to one embodiment of this invention is illustrated in FIG. 2. The phantom 10 has a very simple structure, and was constructed to fit into a body coil. It consists of layers of parallel grid sheets 11. Each grid sheet 11 is orientated in the xy plane, and has two integrally-formed orthogonal arrays of spaced parallel thin slats or plates 12, so that slats 12 in one array intersect with the slats 12 in the other array. The grid sheets 11 are equally spaced along the third dimension (the z axis).

Figure 1:
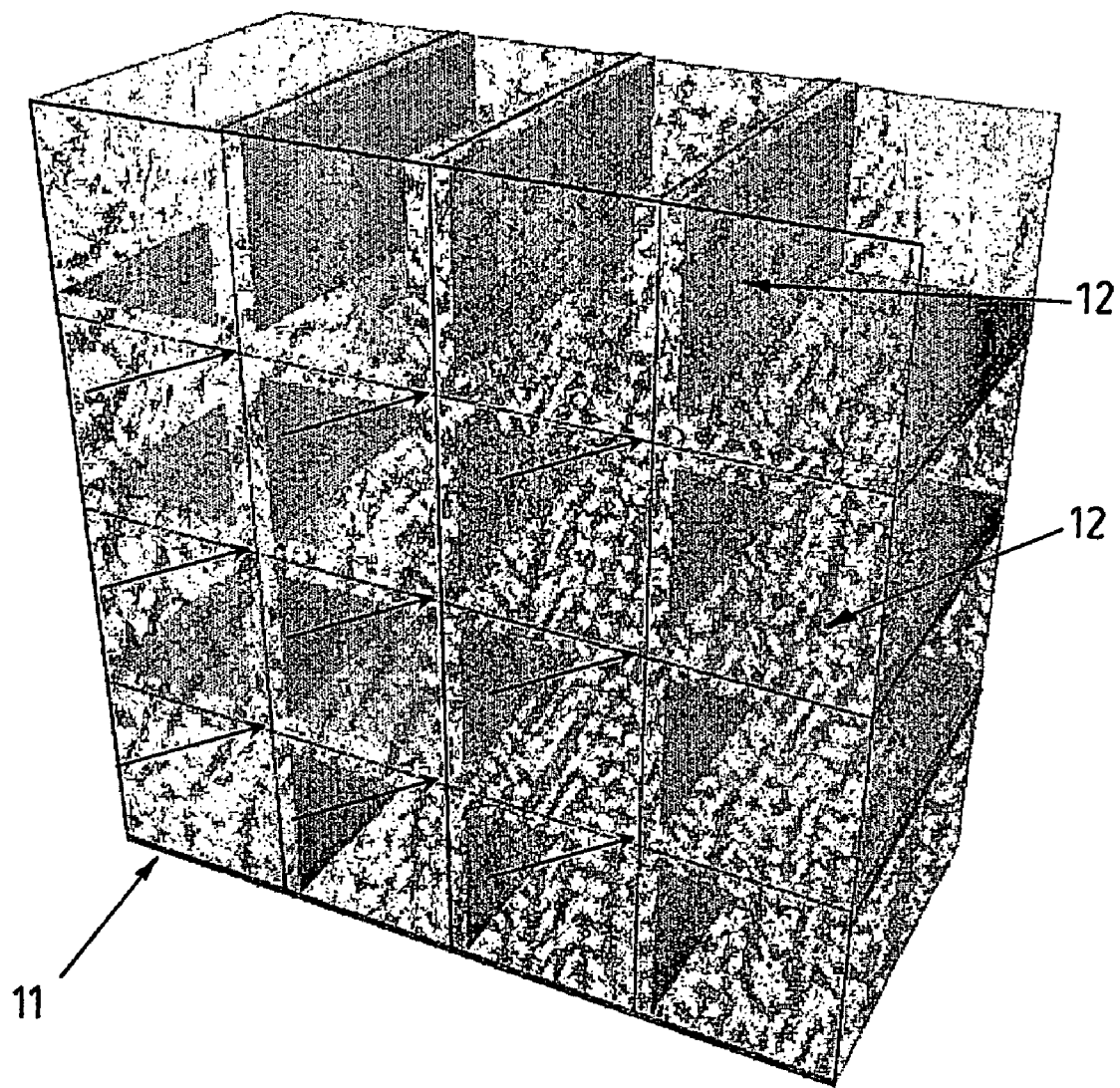
FIG. 1 is a schematic illustration of the control points (indicated by the arrows) generated using three orthogonal planes.

The basis of the design of the 3D phantom is illustrated in FIG. 1. As indicated by the arrows, each intersection of the slats 12 forms a cross on the surface of a grid sheet 11 which can be used to define a point in space. These points can be viewed as the intercepting points of the three orthogonal planes: the two planes that define the two intersecting slats 12 and the surface plane of the grid sheet 11. These well-defined intersections at the surface of the grid sheets 11 in 3D are used as the control points.

The phantom 10 therefore provides a 3D array of control points. The spacing between the sheets 11 is the same as their thickness so the control points along the z axis are equally spaced. The external dimensions of the illustrated phantom 10 are 310 mm×310 mm×310 mm, which forms a cube. The grid sheets 11 are 9 mm in thickness. These grid sheets 11 are readily available as they are normally used for building ventilation. All the wall plates or slats 12 and control surfaces of the grid sheets 11 were machined with precision to ensure the regularity of the grid pattern of the phantom. The grids 11 are slightly non-square, 14.28 mm along one dimension (denoted as the x direction) and 14.39 mm along the other dimension (denoted as the y axis). The width of the grid sheets 11 is 9.0 mm.

In the phantom 10 shown in FIG. 2, the grid sheets 11 contain 19 grid crosses along each of the x and y axes, producing 361 points on each side of the sheet surfaces. The phantom contained 15 grid sheets, and hence provided 10,830 points that can be used as control points. These points form a regular 3D array. The dimensions between the array points along the three orthogonal axes are denoted, respectively, as $C_x$, $C_y$ and $C_z$. For the phantom 10 shown in FIG. 2, $C_x$=14.28 mm, $C_y$=14.39 mm and $C_z$=9.00 mm. Arranging the control points in a 3D matrix enables a large number of control points to be achieved in a compact space.

To measure imaging distortion, the phantom 10 is first filled with a water solution which fills the interstices in the phantom. The water solution is suitably prepared according to the method recommended by American Association of Physicists in Medicine (AAPM).

An advantageous aspect of the method of this invention is the manner in which the positions of the control points are measured. Namely, the positions of the control points are determined by the positions of the planes (see FIG. 1). The z coordinate is determined by the interfacial boundary formed between a surface of the grid sheet and the water. The x and y coordinates are each determined by a pair of interfaces between the walls of the grid slats or plates and the water, with the middle position of the two interfaces being taken as the x and y coordinates. Therefore, the positions of the control points are determined by detecting the positions of the interfacial boundaries. These interfacial boundaries are normally manifested as image edges and the extraction of the interfacial boundaries becomes an exercise in edge detection.

There are various known methods for image edge detection, particularly for 2D images, and any suitable method may be used. However, the preferred method is the use of the first derivatives evaluated in 3 dimensions to detect these edges and consequently to detect the interfacial boundaries. In the preferred embodiment, the operators used for deriving approximate first derivatives in 3 dimensions are the extended 3D Prewitt operators described below.

Prewitt operators were initially introduced in 2D to provide an approximation for the first derivatives [3]. These operators can be viewed as a discrete evaluation of the first derivatives. The 2D Prewitt operators can be defined by a set of 3×3 masks [3]. For example, the mask that is used for an approximate first derivative along the +x axis (the horizontal axis of the image) is $$\begin{bmatrix} -1 & 0 & 1 \\ -1 & 0 & 1 \\ -1 & 0 & 1 \end{bmatrix}$$

The convolution of this mask with a 2-dimensional image will provide an approximation for the first derivative along the +x axis for every pixel in the image, except for those pixels on the image boundaries for which the Prewitt operators are not applicable. The explicit calculation involved in the convolution process is $$g^x(i,j)=f(i+1,j-1)-f(i-1,j-1)+f(i+1,j)-f(i-1,j)+f(i+1,j+1)-f(i-1,j+1) \tag{1}$$

where $g^x(i, j)$ denotes the approximate first derivative along the +x axis for the pixel at (i, j) and f is the image function (gray scale intensity). A scaling factor ⅓ is often used to normalize the first derivatives.

Figure 3:
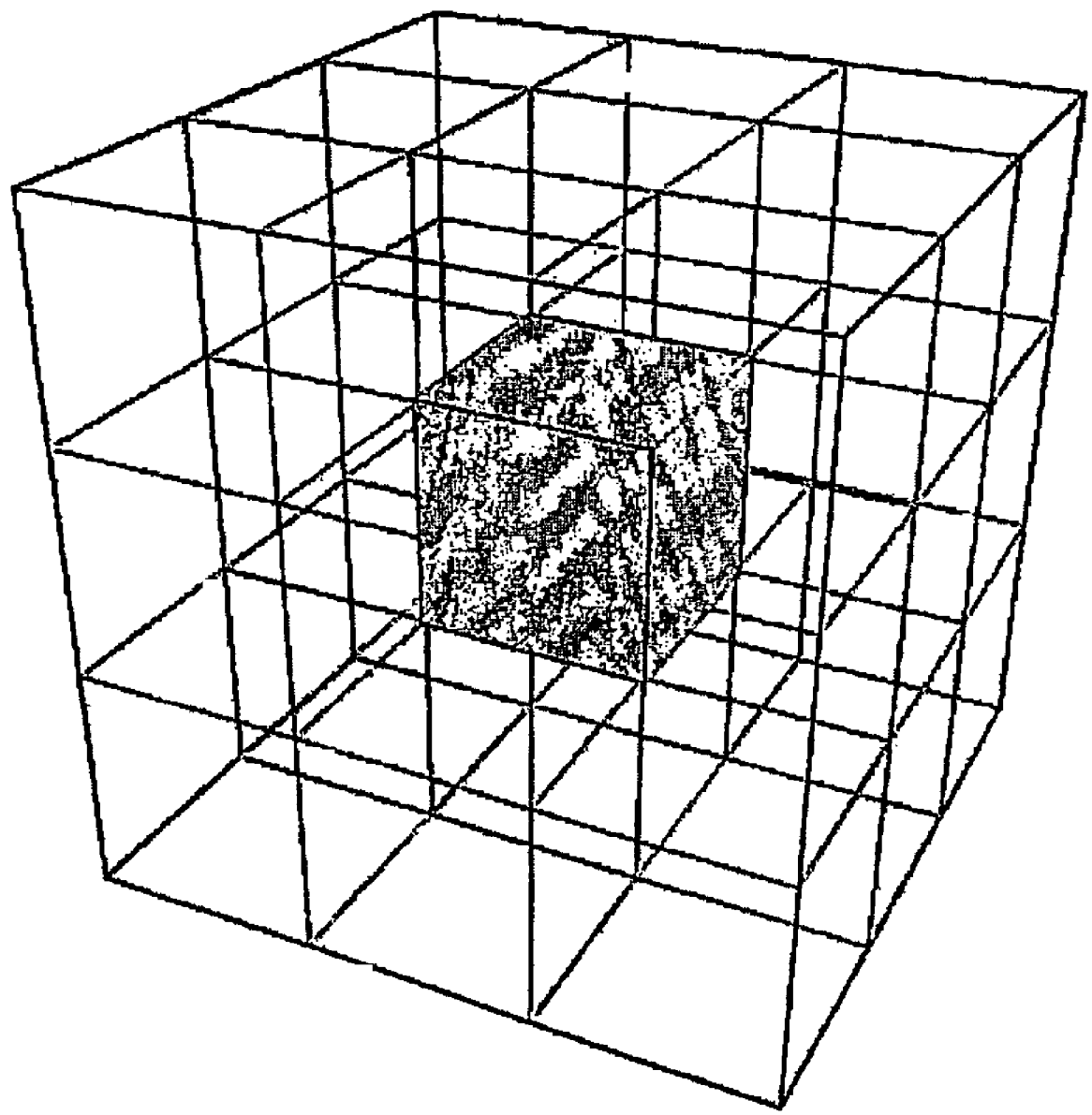
FIG. 3 is a graphic presentation of the 26 neighboring voxels used in a 3D Prewitt operator.

The 2D Prewitt operators are extended to provide an approximation for the first derivatives in 3D. The 3D equivalents of the 2D Prewitt operators are defined by a set of 3×3×3 masks. In this embodiment of the invention, each of these masks contains 26 neighboring voxels as shown in FIG. 3. For convenience, these operators are referred to as 3D Prewitt operators. Only the 3D Prewitt operators that provide approximate values of the first derivative along the three principal axes, x, y and z axes (or, i, j, and k directions) are used.

Figure 4:
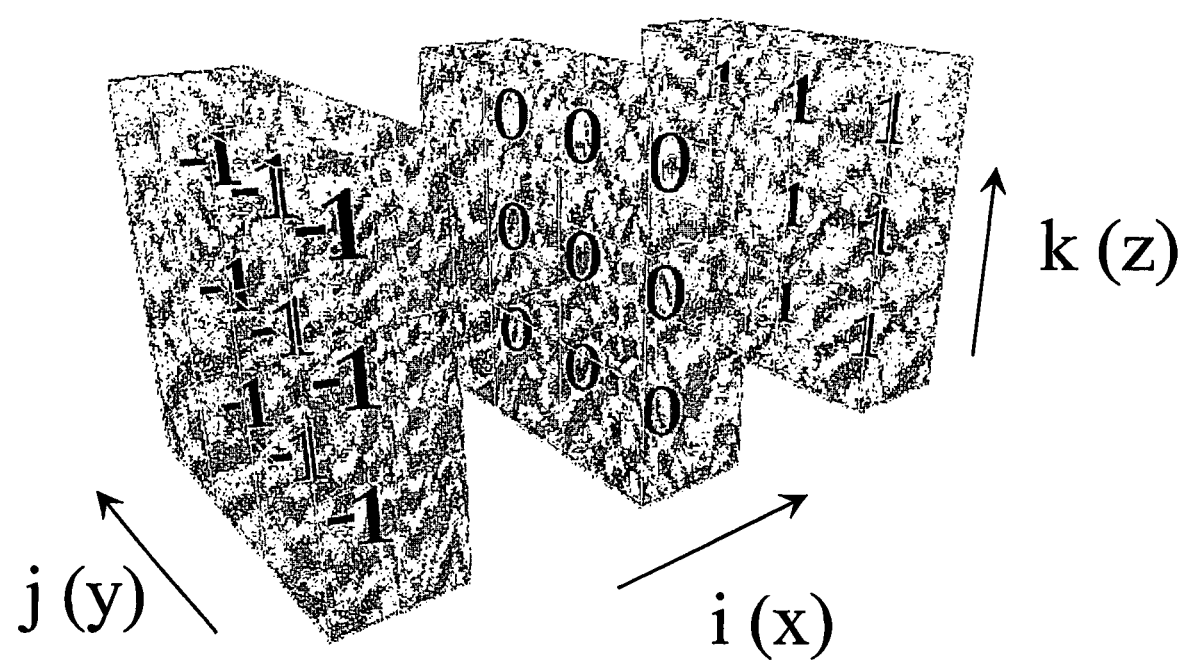
FIG. 4 illustrates a mask used in the 3D Prewitt operator that provides an approximation for the first derivative along the x axis (i direction) as indicated.

The 3D Prewitt operator that provides an approximate value for the first derivative along the +x axis uses a mask as shown in FIG. 4. The explicit calculation involved in the convolution process is $$g^x(i,j,k)=f(i+1,j-1,k-1)-f(i-1,j-1,k-1)+f(i+1,j-1,k)-f(i-1,j-1,k)+f(i+1,j-1,k+1)-f(i-1,j-1,k+1)+f(i+1,j,k-1)-f(i-1,j,k-1)+f(i+1,j,k)-f(i-1,j,k)+f(i+1,j,k+1)-f(i-1,j,k+1)+f(i+1,j+1,k-1)-f(i-1,j+1,k-1)+f(i+1,j+1,k)-f(i-1,j+1,k)+f(i+1,j+1,k+1)-f(i-1,j+1,k+1) \tag{2}$$

where $g^x(i, j, k)$ is the approximate value for the first derivative for the voxel at (i, j, k), and f is the image function in 3D. The first derivative is approximated by averaging the differences of the gray scale intensities between nine pairs of the neighboring voxels. By simply rotating the axes, masks can be defined for the two operators that provide approximate values for the first derivatives along the y and z axes. The calculations involved in the corresponding convolution processes are $$g^y(i,j,k)=f(i-1,j+1,k-1)-f(i-1,j-1,k-1)+f(i-1,j+1,k)-f(i-1,j-1,k)+f(i-1,j+1,k+1)-f(i-1,j-1,k+1)+f(i,j+1,k-1)-f(i,j-1,k-1)+f(i,j+1,k)-f(i,j-1,k)+f(i,j+1,k+1)-f(i,j-1,k+1)+f(i+1,j+1,k-1)-f(i+1,j-1,k-1)+f(i+1,j+1,k)-f(i+1,j-1,k)+f(i+1,j+1,k+1)-f(i+1,j-1,k+1) \tag{3}$$

and $$g^z(i,j,k)=f(i-1,j-1,k+1)-f(i-1,j-1,k-1)+f(i-1,j,k+1)-f(i-1,j,k-1)+f(i-1,j+1,k+1)-f(i-1,j+1,k-1)+f(i,j-1,k+1)-f(i,j-1,k-1)+f(i,j,k+1)-f(i,j,k-1)+f(i,j+1,k+1)-f(i,j+1,k-1)+f(i+1,j-1,k+1)-f(i+1,j-1,k-1)+f(i+1,j,k+1)-f(i+1,j,k-1)+f(i+1,j+1,k+1)-f(i+1,j+1,k-1) \tag{4}$$

where $g^y(i, j, k)$ and $g^z(i, j, k)$ are the approximate values for the first derivatives along the y and z axes.

The method used for measuring or locating the positions of the control points in MR images of the 3D phantom is fully automated, using appropriate image processing tools. This method involves two separate steps. The first step is to identify a set of reference voxels whose positions can be taken as an initial estimation of the positions of the control points in the image. In conventional approaches using point-like objects as source of control points, clusters of voxels whose center of gravity is taken as an approximation for the positions of the control points have been used. However, a different method has been developed for use in the preferred embodiment wherein orthogonal planes are used to define the control points. This method, described below, provides an initial estimate for the positions of the control points.

In a subsequent step, the final positions of the control points are then determined by the positions of the planes using the first moments calculated on the images formed by the magnitude of the first derivatives. The initial estimated positions of the control points obtained in the first step are used to assist an optimal placement of a region of interest in which the positions of the planes are to be evaluated.

Figure 5:
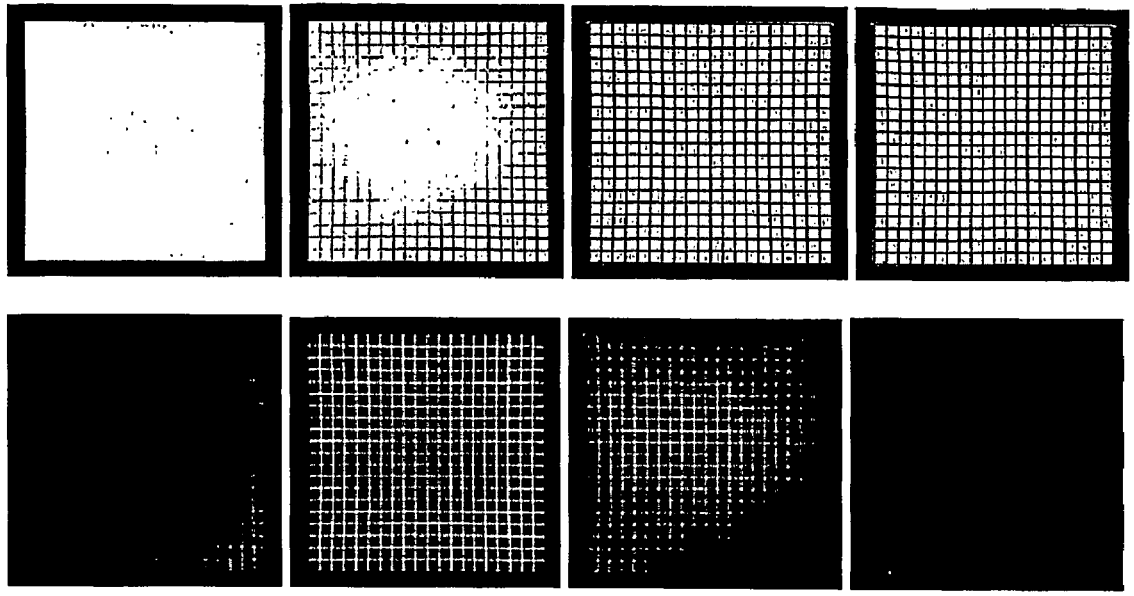
FIG. 5 illustrates a sequence of transverse slices selected in close proximity to an interface between a grid sheet surface and surrounding water (top row); and the corresponding images based on the magnitude of the first derivative calculated along the z axis using a 3D Prewitt operator (bottom row).

A. Identification of the Reference Voxels for Initial Estimation for the Positions of the Control Points As noted above, the interfacial boundaries that are used to define the control points in the present method are manifested as image edges, as demonstrated in FIG. 5. In FIG. 5, the top row shows a sequence of transverse slices of the gray scale intensity images in the proximity of an interfacial boundary between a grid sheet surface and the water. Moving from left to right, the slice's position moves from a position in the inter-layer gap (in the water) near the interface to a position that cuts through the grid sheet. As shown, the interfacial boundary occurred near the slice second from the left. In the bottom row, the images based on the magnitude of the first derivative along the z axis, $|g^z(i, j, k)|$, are shown. It is clearly demonstrated here that the interfacial boundary is manifested as image edges.

Figure 6:
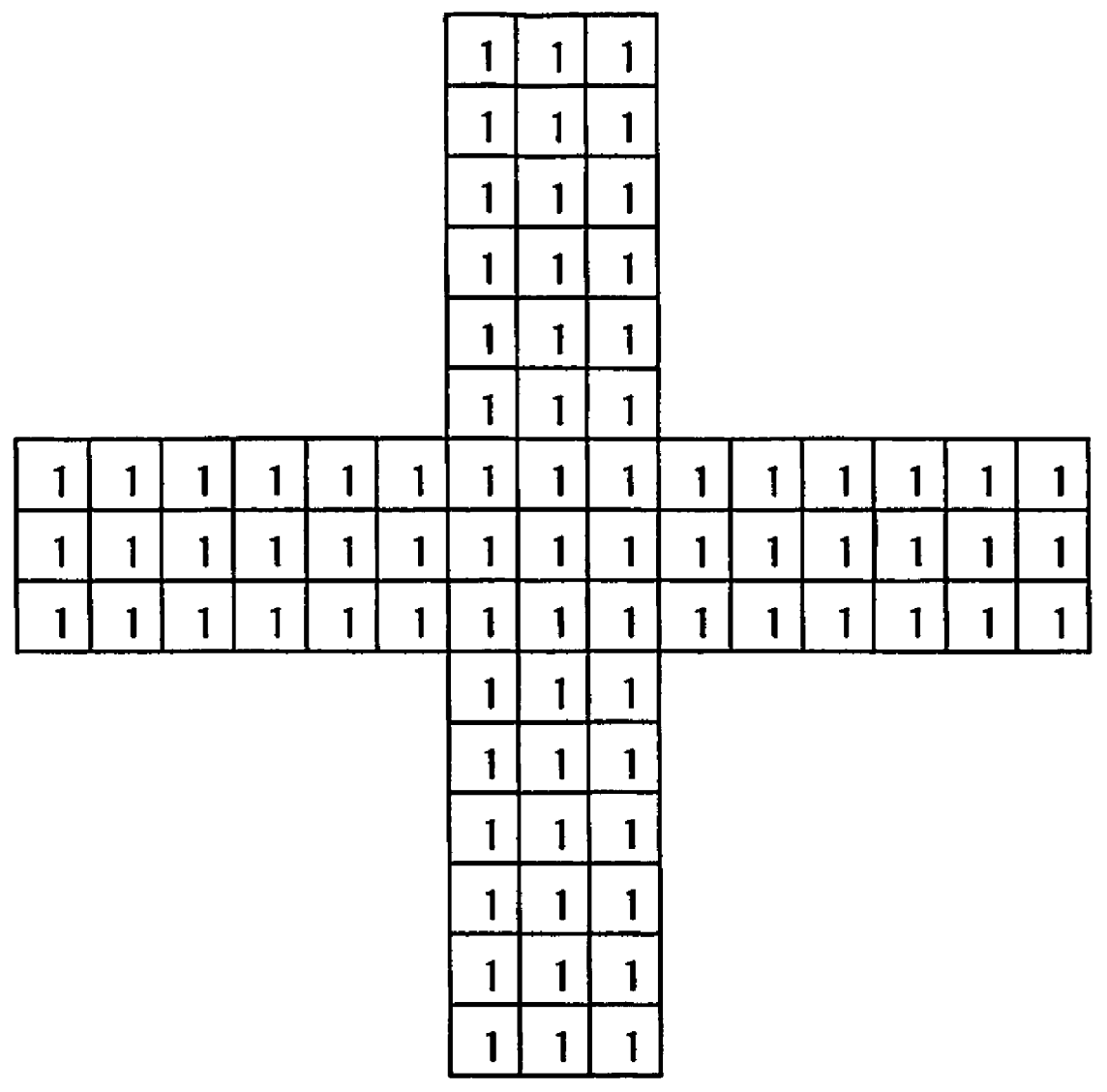
Figure 7:
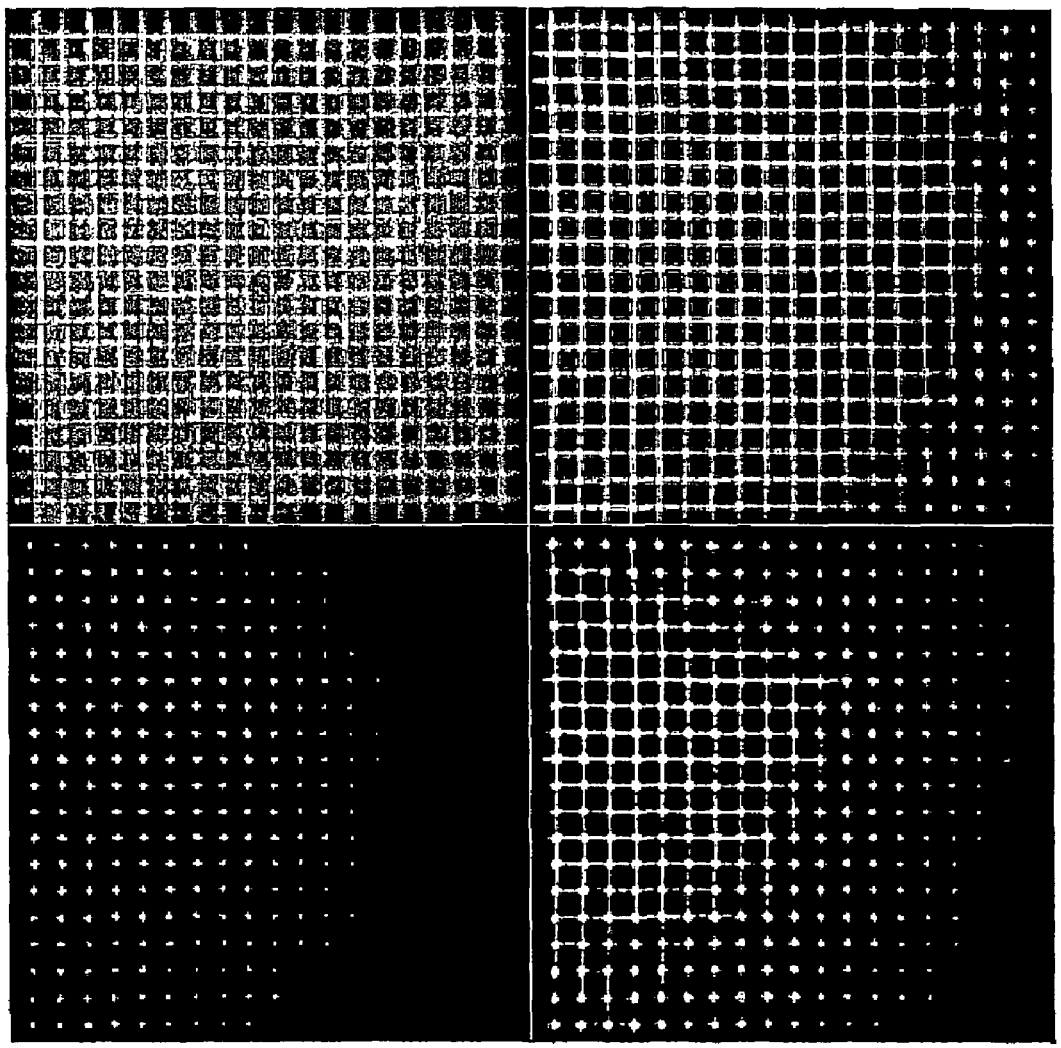
FIG. 7 illustrates a representative transverse slice of the convoluted derivative image (top left corner) and three images obtained with different threshold levels to aid visual recognition of the enhanced prominence of the voxels at the crosses.
Figure 8:
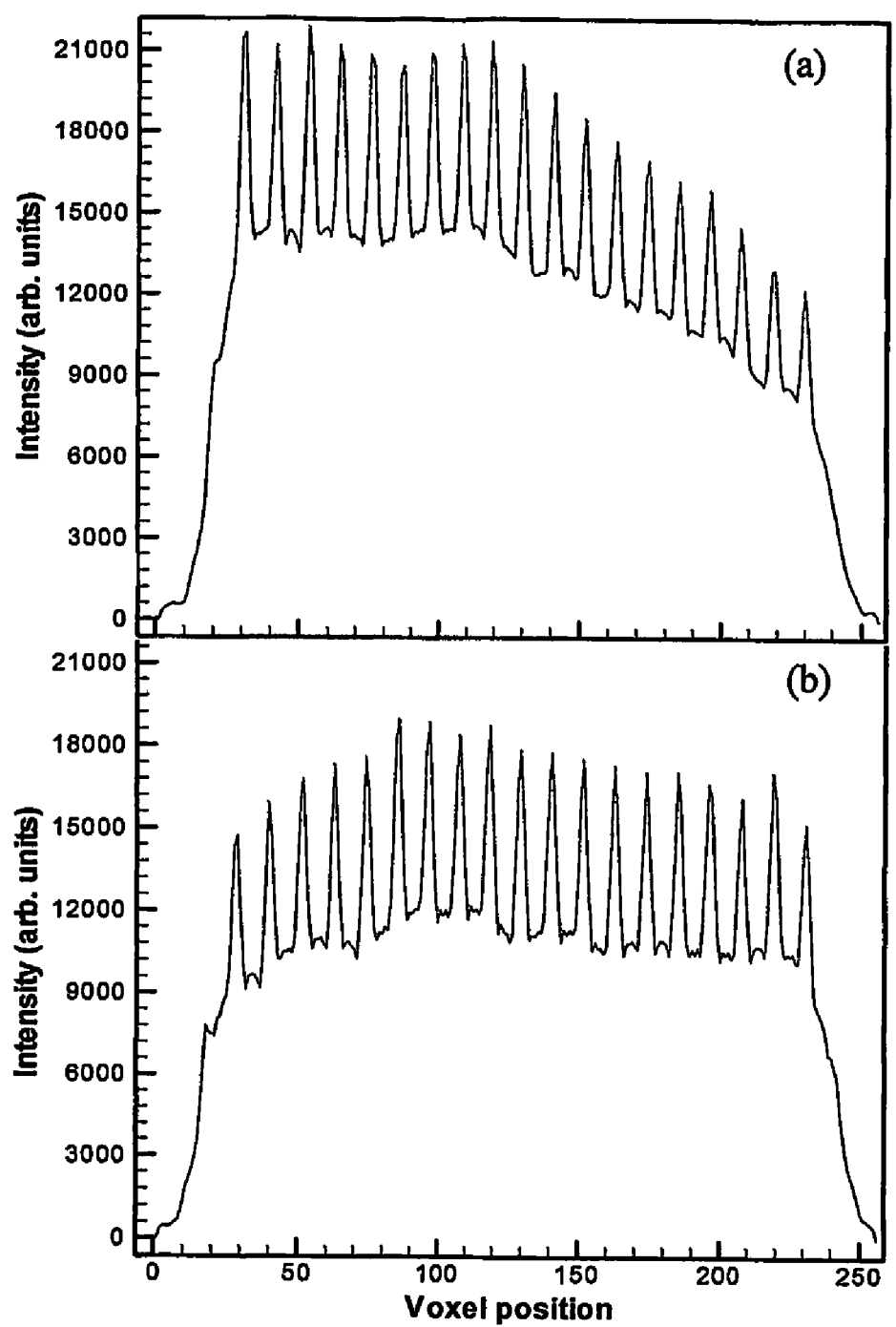
FIGS. 8(a) and (b) illustrate two representative 1D intensity profiles, one selected along the x axis (a) and one selected along the y axis (b) of the convoluted derivative images. The two lines were selected passing at the central cross (see FIG. 7).

The next step is to further enhance the prominence of the voxels at the crosses to assist their identification. This is achieved through a convolution using a cross-like mask as shown in FIG. 6. The convolution of this mask with $|g^z(i, j, k)|$ adds more intensity weight for voxels at the crosses than those on the edges of the grids. The size of the mask used in this convolution is not particularly crucial. The convolution is carried out in the xy plane. A representative transverse slice of the convoluted derivative image is shown in the top left corner of FIG. 7. (The other three images included in FIG. 7, obtained with different threshold levels, were to make the prominence of the crosses more perceptible). In FIG. 8, two representative 1D intensity profiles, one selected along the x axis (a) and the other selected along the y axis (b) are presented. As clearly shown here, the intensity of the voxels at the crosses is significantly higher. The 19 peaks in each profile correspond to the 19 crosses. The voxels that have the local maximum intensity are located and taken as the reference voxels. In this way, the position of each control point is approximated by the position of a reference voxel.

The actual process for identifying the reference voxels for the entire set of the control points is as follows. First, the location of the corner array point with the array indexes (1, 1, 1) is estimated through visual inspection of the image data set. A box of 7×7×7 is then placed centrally at the given location and the search for the voxel that has the local maximum intensity within the box is carried out. The voxel that has the maximum intensity is assigned as the reference voxel for the first control point at the corner. Then, the identification process moves through the entire array of the phantom point by point along each dimension. At each identified array point (called the current array point), in order to identify a reference voxel that represents the next array point, a new location is first drawn. This new location is moved from the current array point in steps of the cubical dimensions of the array, $C_x$, $C_y$ or $C_z$, depending on the direction along which the search is carried out. The search is repeated and the designated voxel is assigned. This process repeats until all the array points are covered. This ordered search process avoids any regions that are close to the interfacial boundaries between the water and the two internal walls of the phantom that are perpendicular to the z axis because voxels in these regions have high intensities in the convoluted derivative images. Any involvement of these regions in the search of the reference voxels could complicate the search process.

B. The Final Measurement of the Positions of the Control Points by Using the Positions of the Planes The identified reference voxels provide an initial estimation of the position of the control points in the phantom images and are used to assist in the calculation of the positions of the planes from which the positions of the control points are finally determined. The positions of the three planes are determined using the first moments of the magnitude of the first derivatives evaluated along the three principal axes (Eqs. (2)-(4) above). In order to gain insight into the calculation of the positions of the planes, it is useful to examine some 1D profiles of image gray scale intensity and the magnitude of the first derivatives in the neighborhood of a control point.

Figure 9:
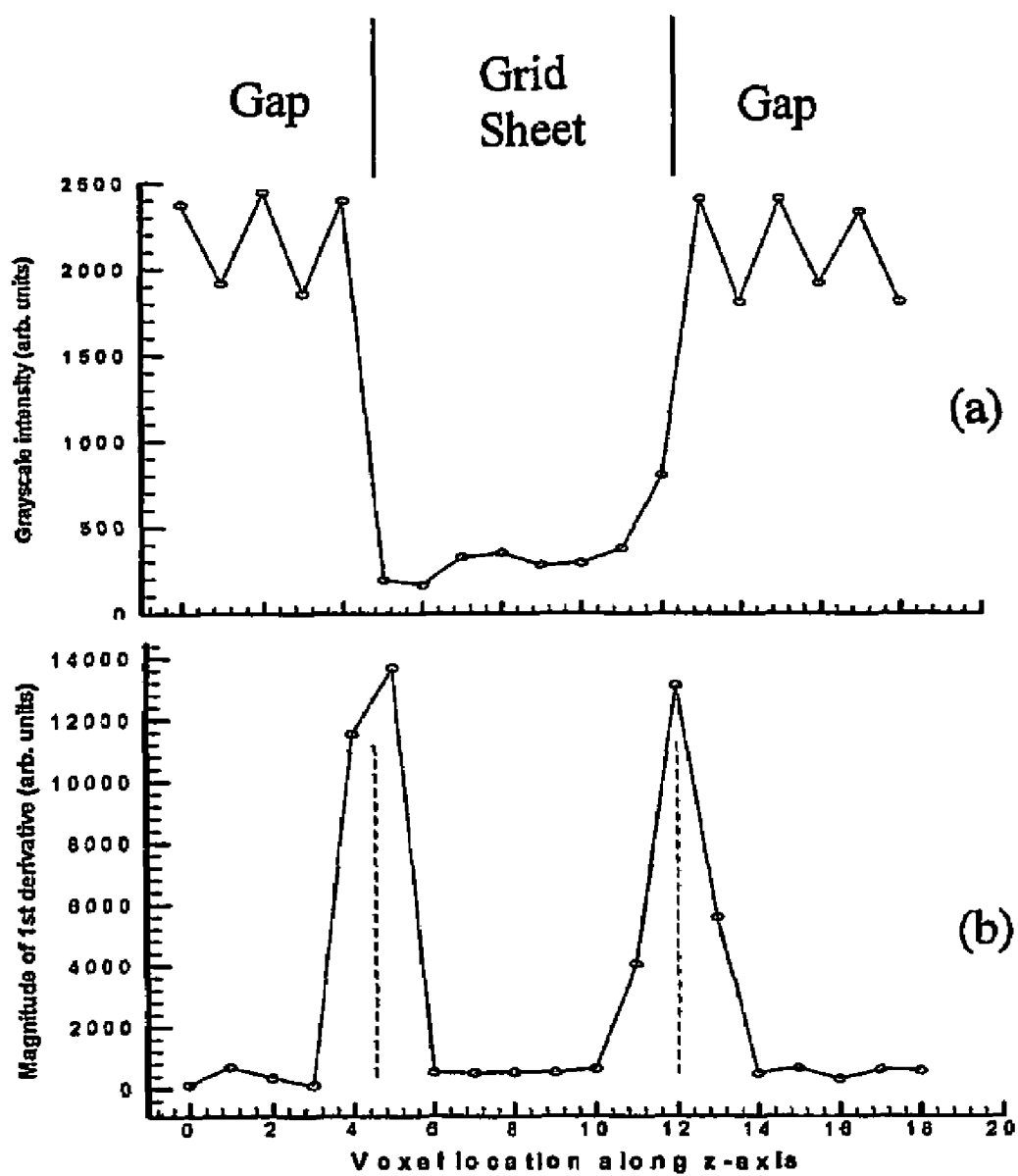
FIGS. 9(a) and (b) illustrate representative 1D profiles of the image intensity for a sequence of voxels taken along a line parallel to the z axis (a); and the magnitude of the first derivative calculated along the z axis for the same voxels (b). The two edges in (a) correspond to the two interfacial boundaries between the grid sheet surfaces and the water. The dashed lines in (b) indicate the positions of the interfacial boundaries and were obtained using the first moments.

In FIG. 9(a), representative 1D profiles of the image intensity for a group of voxels sequentially selected along a line parallel to the z axis near two control points are shown. Profiles of the magnitude of the first derivative for the selected voxels calculated along the z direction are given in FIG. 9(b). As shown, the z positions of the planes (the interfacial boundaries between the surfaces of the grid sheet and the water) are well defined especially in the derivative profiles in FIG. 9(b).

In this method, the z position of the planes is defined as the central position of the peak in the derivative profile. These central positions are calculated using the first moment $\overline{K}(i,j)$ $$\overline{K}(i, j) = \frac{\sum_{p=1}^{n_z} k_p |g^z(i, j, k_p)|}{\sum_{p=1}^{n_z} |g^z(i, j, k_p)|} \quad (5)$$

where $n_z$ is the number of voxels used in the evaluation of the first moment. Typical values for $n_z$ are 5, 7 or 9. The position $(i, j, \overline{K}(i, j))$ is then taken as the position of the plane at the sampled location. In the method, the plane is sampled in a small neighborhood. For the plane perpendicular to the z axis, a neighborhood of 3×3 or 5×5 is used. These sampled plane positions can be fitted into a plane equation in 3D using an algorithm, such as the non-linear Levenberg-Marquardt method. The plane obtained by such a non-linear fitting method, together with the other two planes to be derived in a similar manner from the first derivatives calculated along the x and y axes, will yield an intercepting point and this point could be taken as a control point.

Figure 10:
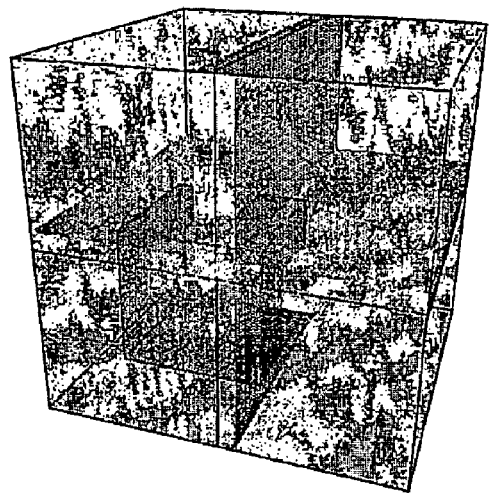
FIGS. 10(a) and (b) are schematic diagrams showing the placement of PSVs for the calculation of the first moments used in the determination of the coordinates: namely, (a) the placement of PSV(z) for the z coordinate calculation; (b) the placement of PSV(xy) for the x and y coordinate calculations.
Figure 10:
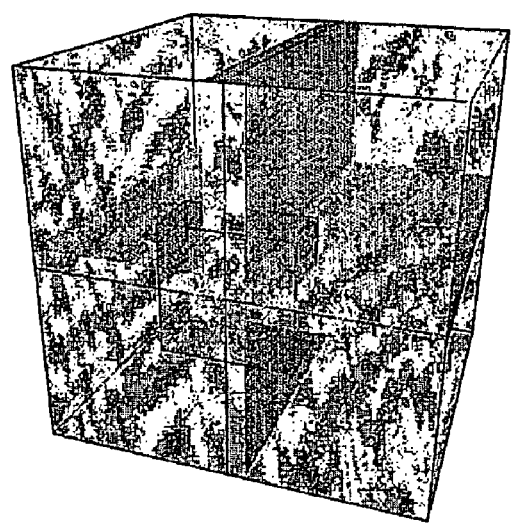

However, in a fully automated algorithm such as the one used in the preferred embodiment, the use of a fitting process may pose problems in implementing an effective procedure for convergence checks. Therefore, an approximation is preferably used. In this approximation, the mean value of the sampled $\overline{K}(i,j)$ in the specified neighborhood is taken as the z coordinate of the control point. In a similar fashion the x and y coordinates are assigned by the mean positions of the other two planes, as described below. The voxels used in the determination of the position of the plane form a volume, and this volume is referred to as the plane sampling volume (PSV). For the determination of the z position of the control points, this volume is denoted as PSV(z). For a neighborhood of 5×5 with 7 voxels used in the evaluation of the first moment, PSV(z) is 5×5×7. The placement of the PSV(z) is centred at the reference voxel as shown schematically in FIG. 10(a), (FIG. 10(b) shows the placement of PSV(xy), the plane sampling volume used for the determination of the x and y coordinates).

Figure 11:
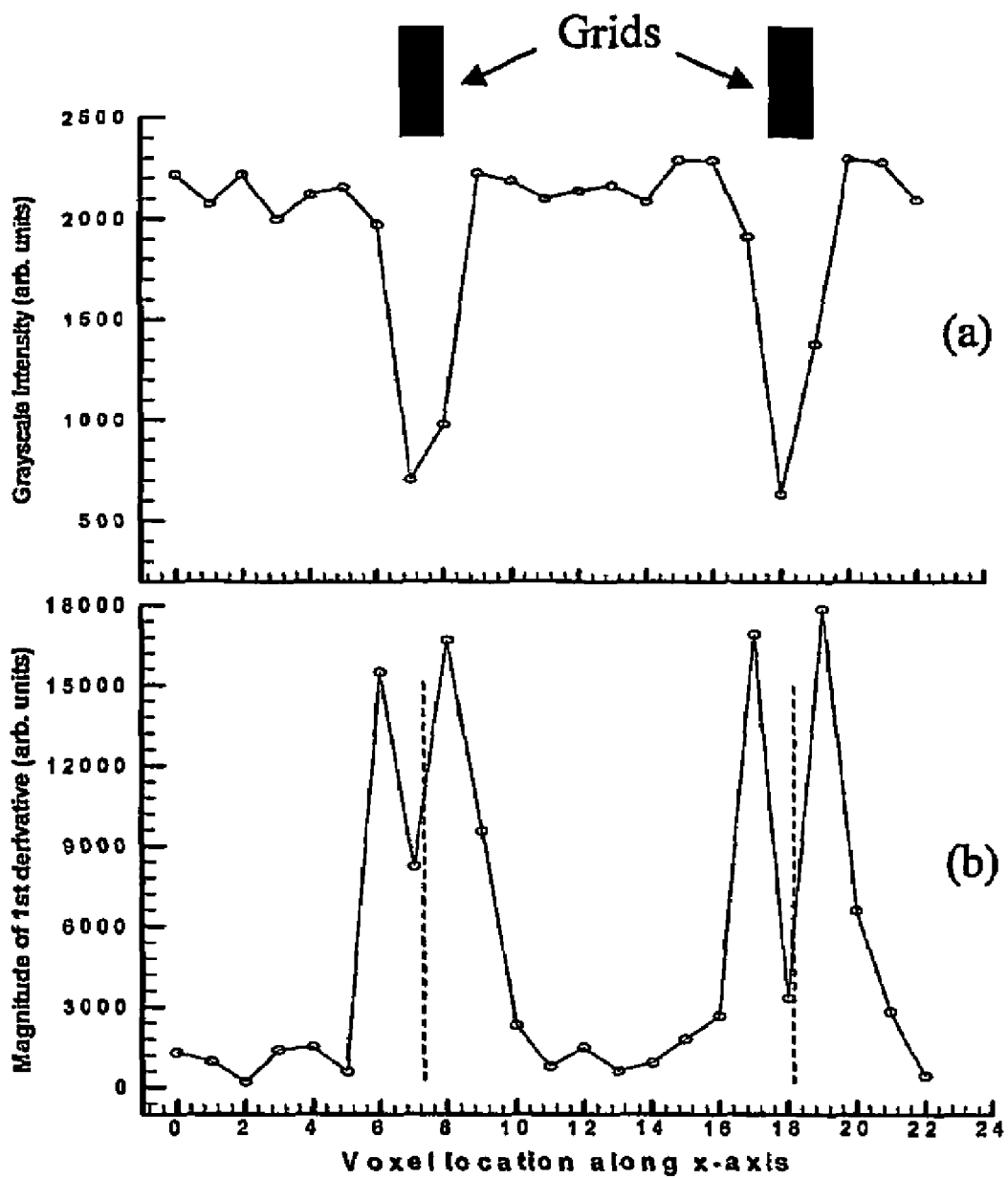
FIG. 11(a) illustrates representative 1D profiles of the image intensity for a sequence of voxels taken along a line parallel to the x axis.
FIG. 11(b) illustrates the magnitude of the first derivative calculated along the x axis for the same voxels. The two close interfacial boundaries between grid sidewalls and the water are well resolved in the derivative profile (b). The dashed lines in (b) indicate the middle positions of the interfacial boundaries and were obtained using the first moments.

The measurements of the positions of the control points along the x and y axes are carried out in a similar manner to that for the z coordinate. In FIG. 11(a), representative 1D profiles of the image intensity for voxels sequentially selected along a line parallel to the x axis near two control points are shown, while in FIG. 11(b) the magnitude of the first derivative calculated along the x axis for the same voxels is given. As shown in FIG. 1, for the x (and y) coordinate, two interfacial boundaries on the opposite sides of the slats (or plates) are employed. As the separation between the two boundaries is the width of the slat, which in the illustrated embodiment, is only ~1.5 mm, the two interfacial boundaries are very close as indicated by slopes in the intensity profile (a) and peaks in the derivative profile (b). The middle position between the two interfacial boundaries is taken as the x position of the plane perpendicular to the x axis. These middle positions can be approximated by the first moment $\bar{I}(j,k)$, calculated as $$\bar{I}(j,k) = \frac{\sum_{p=1}^{n_z} i_p |g^x(i_p, j, k)|}{\sum_{p=1}^{n_z} |g^x(i_p, j, k)|} \tag{6}$$

where $n_x$ is the number of voxels used in the evaluation of the first moment. Typical values for $n_x$ are 7, 9, or 11. The dashed lines in FIG. 11(b) indicate the middle positions of the interfacial boundaries determined by the first moment, $\bar{I}(j,k)$. Like for the z coordinate calculation, the x position is sampled in a small neighborhood with a typical size of 7×3 or 9×4. The mean value of $\bar{I}(j,k)$ sampled in the specified neighborhood is then taken as the x coordinate of the control point. The voxels used in the determination of the x coordinate (and for y as well since the phantom is symmetric with respect to the x and y axes) form a volume and this volume is referred to as PSV(xy). The placement of PSV(xy) is within the frame of the grid as illustrated in FIG. 10(b).

Figure 12:
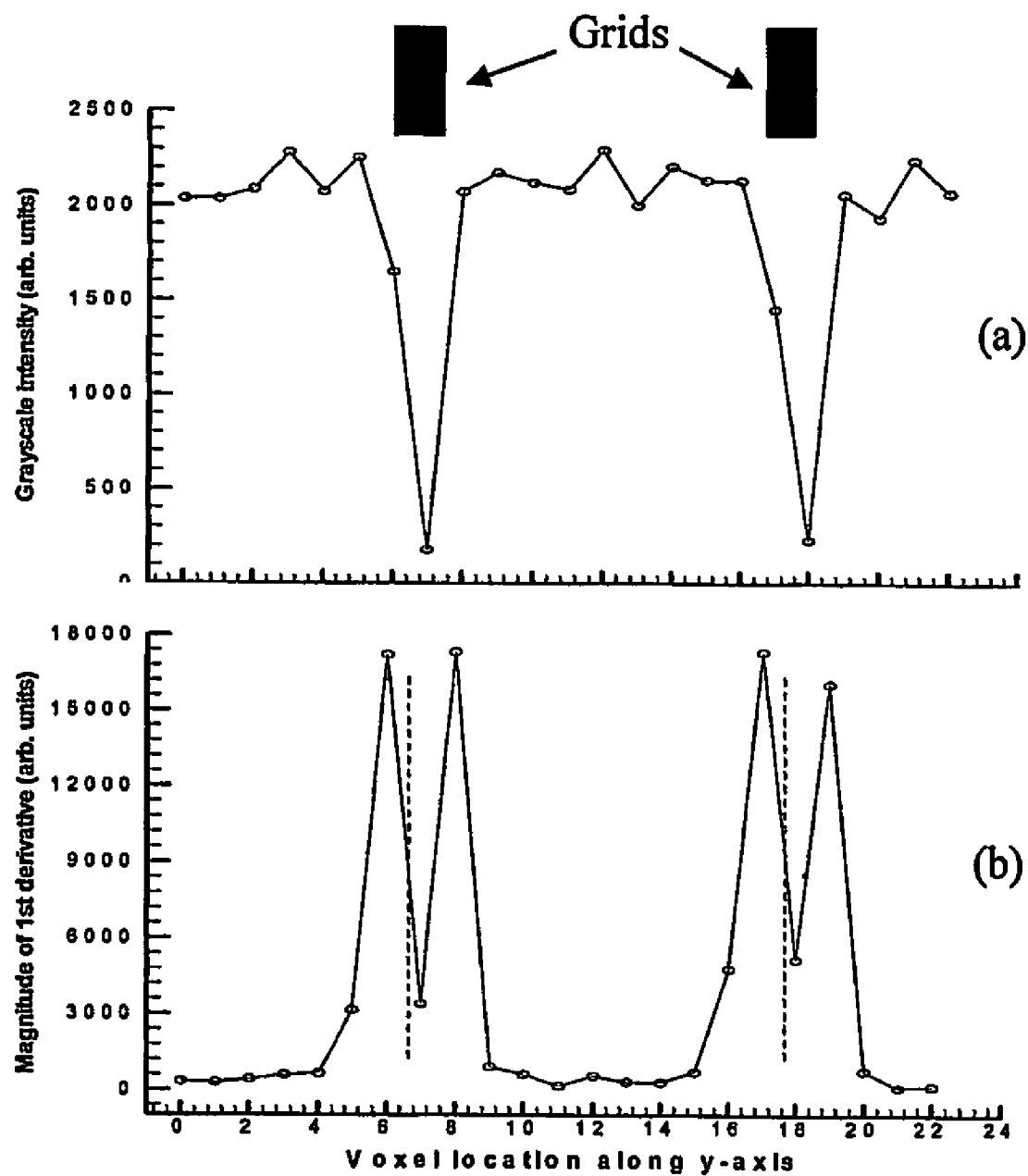
FIG. 12(a) illustrates representative 1D profiles of the image intensity for a sequence of voxels taken along a line parallel to the y axis.
FIG. 12(b) illustrates the magnitude of the first derivative calculated along the y axis for the same voxels. The two close interfacial boundaries between grid sidewalls and the water are well resolved in the derivative profile (b). The dashed lines in (b) indicate the middle positions of the interfacial boundaries and were obtained using the first moments.

For the determination of the y coordinate, the procedure is exactly the same by using the first derivative calculated along the y axis. The first moment $\bar{J}(i,k)$, calculated as $$\bar{J}(i,k) = \frac{\sum_{p=1}^{n_y} j_p |g^y(i, j_p, k)|}{\sum_{p=1}^{n_y} |g^y(i, j_p, k)|} \tag{7}$$

is used for the determination of the y coordinate. Representative 1D profiles involved in the determination of the y coordinate are shown in FIG. 12.

The method of the described embodiment uses a laboratory-based coordinate system for the positions of the control points, measured in Euclidean coordinates. This coordinate axis system has its origin at the isocentre of the scanner which is also taken to be the isocentre of the gradient field generating devices. Its x axis is taken to be along the left/right direction, the y axis along the anterior/superior direction and the z axis along the head/foot direction. The geometric distortion can then be characterized by the differences in the coordinates of the control points $$dx_p = \tilde{x}_p - x_p$$

$$dy_p = \tilde{y}_p - y_p$$

$$dz_p = \tilde{z}_p - z_p$$

$$dr_p = \sqrt{(dx_p)^2 + (dy_p)^2 + (dz_p)^2}$$

$$(p=1,2\ldots N) \tag{8}$$

Here $\tilde{x}_p$, $\tilde{y}_p$ and $\tilde{z}_p$ are the coordinates of the control point p measured in the distorted image space; $x_p$, $y_p$ and $z_p$ are the corresponding coordinates measured in the undistorted physical space of the phantom; and N is the total number of control points. This one-to-one correspondence enables a detailed mapping of geometric distortion to be obtained.

Following the mapping of the geometric distortion using the accurate knowledge of the positions of the control points, the correction of the distortion simply becomes a problem of interpolation. This interpolation can be symbolically expressed as $$\begin{pmatrix} \tilde{x} \\ \tilde{y} \\ \tilde{z} \end{pmatrix} = \wp \begin{pmatrix} x \\ y \\ z \end{pmatrix} \tag{9}$$

where x, y and z are the coordinates of any given spatial point in the undistorted physical space, $\tilde{x}$, $\tilde{y}$ and $\tilde{z}$ are the coordinates of its corresponding point in the distorted image space, and $\wp$ represents an interpolation model through which this correspondence is established. The transformation expressed by Eq. (9) is also referred to as spatial transformation.

There are two general approaches to spatial transformations: global transformation and piecewise interpolation. Global transformations, such as the polynomial transformations, impose a single mapping function upon the entire imaging volume of interest. In that approach, the use of a single function sometimes cannot account adequately for local geometric distortions. In order to provide more adequate description for local distortions, piecewise mapping has been introduced [4]. Piecewise interpolations are preferred for the method of this invention, to ensure a comprehensive and accurate mapping of the geometric distortion.

There are various known models for piecewise interpolation. These models, however, were mainly developed to deal with two dimensional problems. Although some models can be extended to 3D, one problem associated with such extension, particularly for a significantly large number of data points, is the exponential increase in computational time. Trilinear interpolation is preferred. It is a simple interpolation but performs as satisfactorily as more sophisticated interpolation models in most applications. In order to complete the correction process, a second interpolation is required for interpolating the image intensity. Again, the trilinear interpolation is preferred.

The above described distortion measurement and correction method was tested on three separately acquired image data sets. The images were acquired with a Siemens Sonata 1.5T MRI scanner. The phantom was positioned at the magnet isocentre and imaging was performed using a body coil. An inversion recovery gradient echo 3D imaging sequence was used with following imaging parameters: TR=1540 ms; TE=1.53 ms; TI (inversion time)=1100 ms; imaging array size=256×256×256; FOV=334.0 mm×334.0 mm×307.2 mm. The corresponding voxel's dimensions were 1.305 mm×1.305 mm×1.200 mm. Because of the relatively low sensitivity of the body coil, multiple acquisitions were used. Three image data sets were acquired in a single session with the phantom's position unaltered. The first two data sets (data sets 1 and 2) were acquired with four acquisitions each and were acquired one after the other. The third data set (data set 3) was then acquired with eight acquisitions. In the acquired images, as some slices at the phantom edges contained significant image artifacts, only the control points defined by the central part of the phantom within a 19×19×25 array (a total of 9025 control points) were used in evaluating the method. Precision positioning of the phantom in the scanner was enabled using scanner's laser positioning facility.

The reproducibility of the method was tested by comparing the measured positions of the control points between the three repeatedly acquired data sets. The test also included a study of the differences in the measured positions by using different PSV (plane sampling volume) sizes. The measurement of the accuracy of the method can be difficult. Manual identification relying on human vision is sometimes regarded as an "accurate" method but such a claim has always been questioned due to the subjective variability involved. Manual identification is also impractical when the number of the control points in the phantom is large. Moreover, the accuracy in manual identification is limited as it does not provide accuracy at a sub-pixel (or sub-voxel) level. Because of these limitations, accuracy was assessed by estimating the measured residual geometric distortions in the corrected images. If the positions of the control points have been measured accurately, the corrected images can be expected to contain little or no geometric distortion. Any residual distortion measured in the corrected images can then be used as an overall measure of the accuracy.

Figure 13:
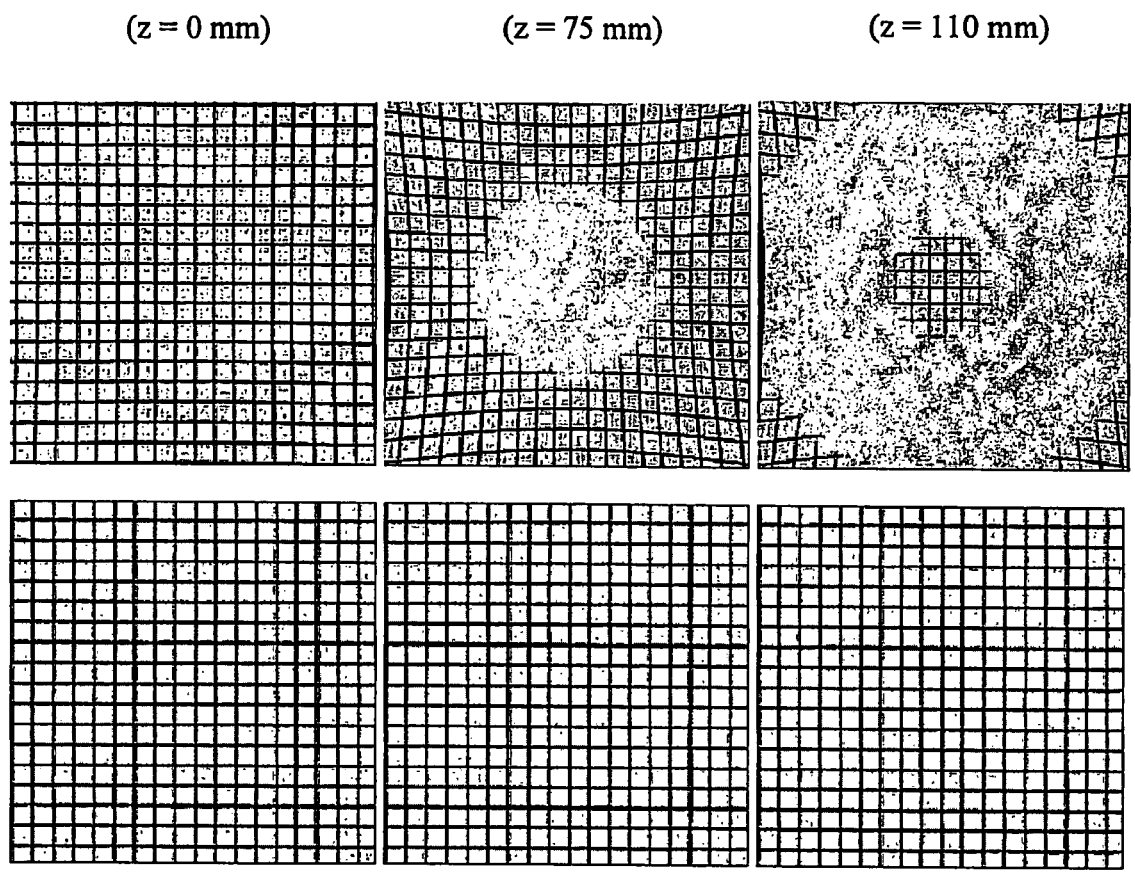
FIG. 13 illustrates representative transverse slices of the phantom image selected at different locations before correction (top row); and three slices selected at similar locations after correction (bottom row).

Representative transverse slices of uncorrected phantom images are shown in the top row of FIG. 13. Geometric distortions are clearly visible in these images. The distortion increases as the distance from the magnet isocentre increases. For example, in the slice shown in the top right corner of FIG. 13 which is at z=110 mm, the grids shown in the central region and those in the corner areas were actually from two neighboring grid sheets. Representative slices of the corrected images are shown in the bottom row. By visual inspection, the corrected images showed no noticeable geometric distortion.

Figure 14:
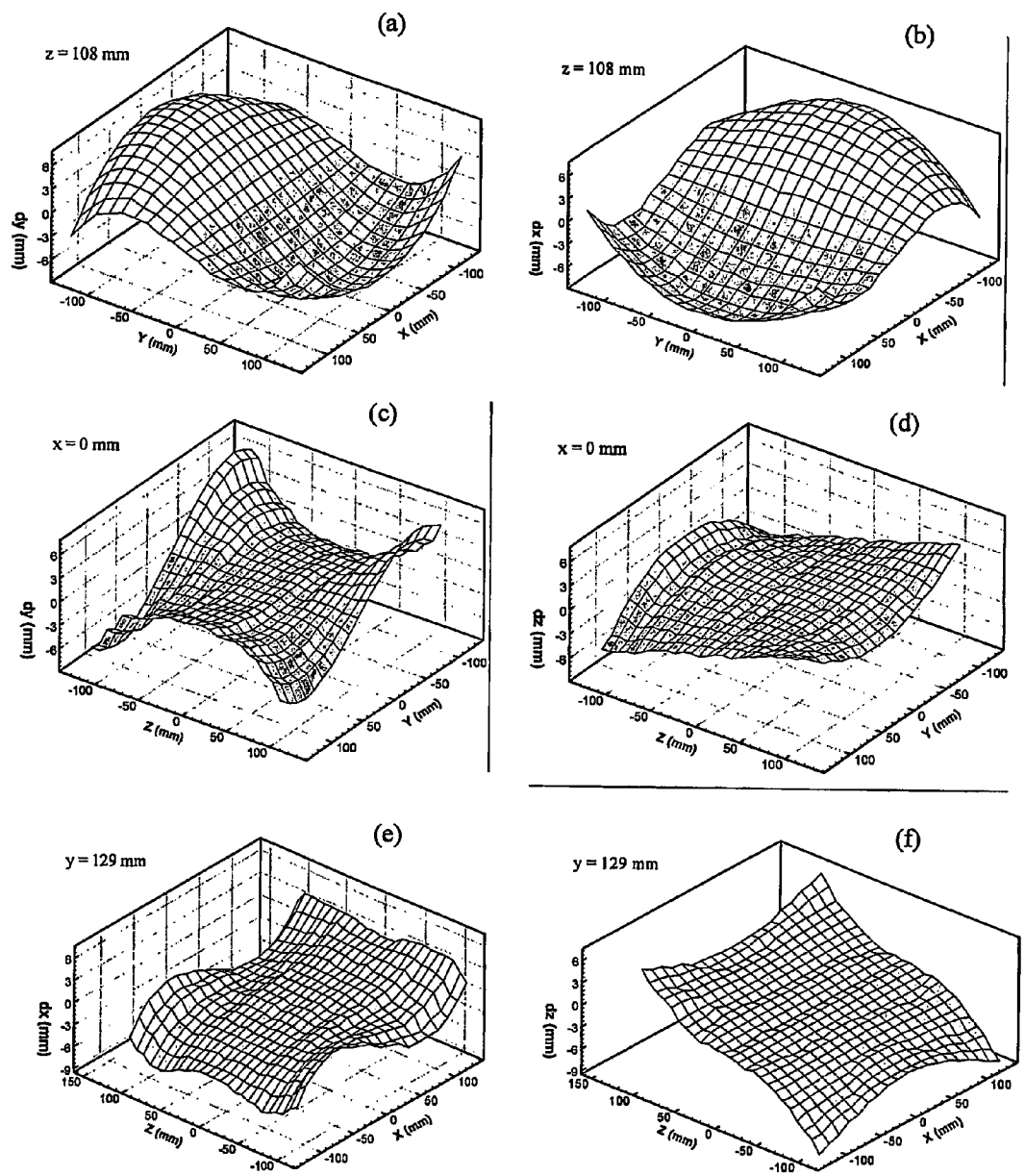
FIGS. 14(a) to (f) depict samples of the measured geometric distortion in certain planes at different locations.
Figure 15:
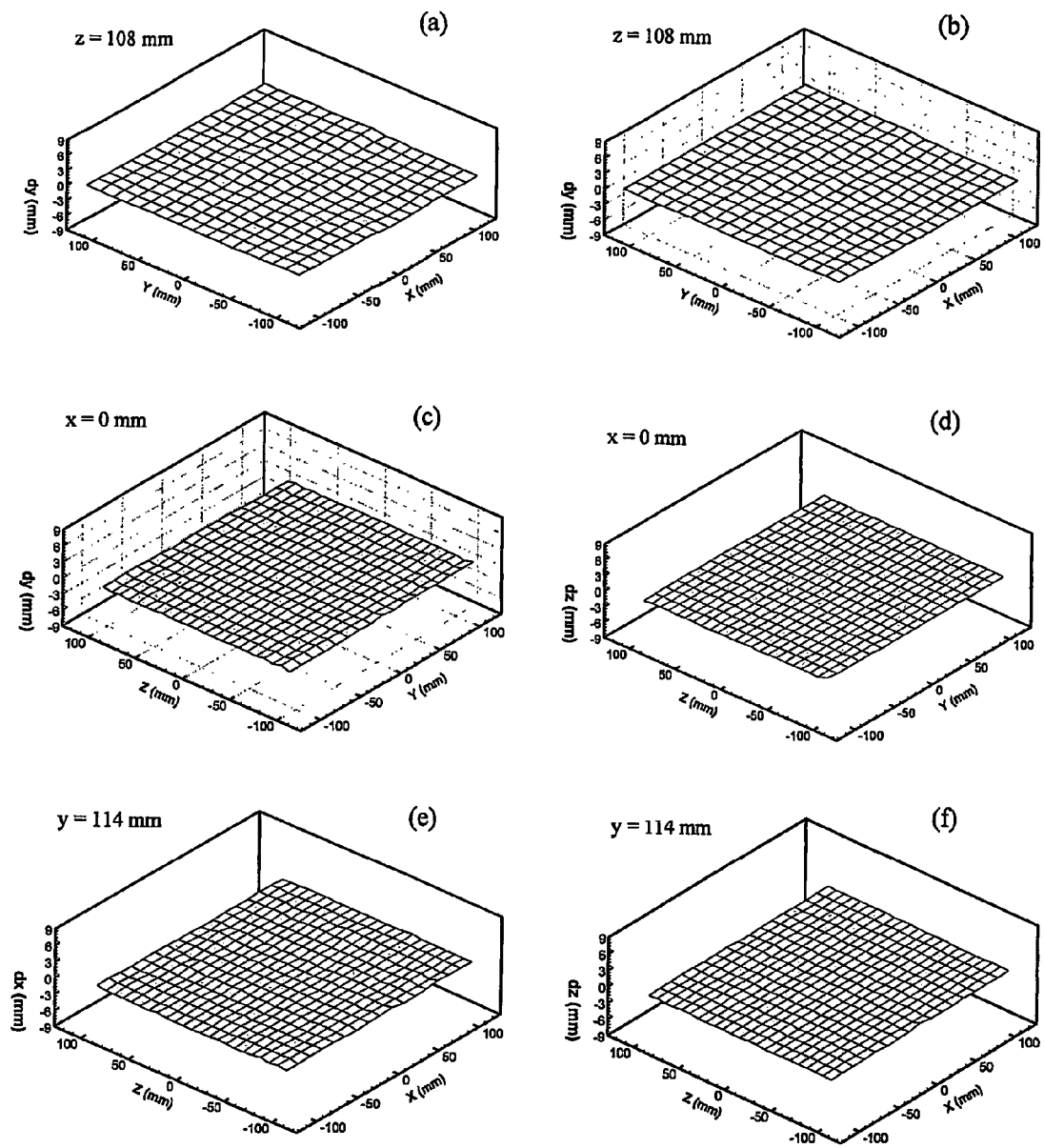
FIGS. 15(a) to (f) depict samples of the measured residual geometric distortion in the corrected images in certain planes at different locations.

More quantitative analysis relating to the geometric distortion is presented in FIG. 14 which shows geometric distortion in certain selected planes, obtained by calculating the positional differences (Eq. (8)). Significantly large positional differences are present. Maximum differences were over 9.00 mm in the uncorrected images. For comparison, samples of the positional differences measured in the corrected images are given in FIG. 15. It is apparent that in the corrected images the differences were negligible. The maximum differences were ~0.6 mm.

Representative quantitative results on reproducibility and accuracy are presented in Tables 1-3. In Table 1, statistical data for the absolute differences in the measured coordinates of the control points compared between three repeated data sets are tabulated. The means errors in the absolute differences in the coordinates (x, y, and z) and in the positional displacement (r) are only ~0.1 mm or less, indicating an excellent reproducibility. The standard deviations are also very small. Also included is the maximum absolute difference. There is no single control point whose absolute difference either along the principal axes (x, y and z) or in its positional displacement exceeded 0.7 mm. In Table 2, representative statistical data on the differences in the coordinates obtained using two different sets of PSVs are presented, showing an extremely high level of reproducibility. Both the means and standard deviations were in the order of 0.1 mm. All maximum absolute differences were less than 0.5 mm.

The representative results for the accuracy assessment are summarized in Table 3, in which the positional differences in the coordinates of the control points between those measured from the phantom images (uncorrected and corrected) and that measured from the known dimensions of the phantom are tabulated. Before the correction, the means absolute differences in the coordinates were about 1.4 mm and in the positional displacement 2.8 mm. The maximum differences were found to vary between 6.9 mm and 9.5 mm for the coordinates and exceeded 10.0 mm for the positional displacement. After correction, the mean absolute differences in the coordinates were ~0.1 mm or less. The mean absolute differences in the positional displacement were slightly larger, between 0.17 mm and 0.21 mm. The standard deviations were 0.10 or less. The maximum absolute differences were ~0.6 mm.

The above described method and apparatus provide two key requirements for comprehensive and accurate 3-dimensional mapping of the geometric distortion, namely a dense distribution of the control points and a robust and accurate method for the positional measurement of these control points. A particular advantage of the method is the high accuracy in the positional measurements of the control points (see Table 3). Even greater accuracy can be achieved for mapping geometric distortion with a head coil. (With head coils, phantom images with smaller voxel sizes and better signal-to-noise ratios can be generated. With smaller voxels, the edges that define the interfacial boundaries become sharper and the positions of the planes can be more accurately measured.)

The simplicity, accuracy and the effectiveness of the method in mapping the geometric distortion renders it suitable in applications of MRI requiring accurate and reproducible imaging, such as in radiosurgery and radiotherapy. The accurately mapped geometric distortion obtained with the method can be used to improve the accuracy and sensitivity both in structural and functional MRI. The method can also provide an effective way for image quality control in large-scale longitudinal studies using MRI.

Any local deformation should not significantly affect the accuracy in the measurement of the positions of the control points as the positions of the planes for each control point are only determined in a small neighborhood, typically 5 to 7 voxels along each direction. On such relatively small scales, any deformations of the planes should be negligibly small and, therefore, the effect due to the deformations should also be small.

The reproducibility data shows that the method is extremely robust. The measured coordinates of the control points, either in repeated image data sets or with differently selected PSV sizes, all show a high level of reproducibility (see Tables 1 and 2). The mean errors were very small, between 0.02 mm and 0.12 mm. The standard deviations were also negligibly small. The maximum differences were ~0.6 mm. It should be noted that this high level of robustness was achieved on the phantom images with relatively low quality. For the three data sets used, the mean SNR (signal-to-noise ratio) was only 13.6 in data set 1, 13.7 in data set 2, and 19.4 in data set 3 (this data set having been acquired with twice the number of acquisitions). In addition, SNR showed large spatial variations in the imaging volume and in some regions, SNR dropped to ~5.0. Also, it was noticed that the intensity of the phantom images was highly inhomogeneous. It is believed that the use of the 3D Prewitt operators contributes to the robustness of the method. These operators inherently have an effective smoothing capability that allows an accurate estimation of the control points.

It should also be noted that the method is entirely automated. There are no steps in which subjective decisions are required.

The 3D phantom can be used to provide a comprehensive quality assurance program for geometric distortion that is not otherwise achievable with phantoms designed for 2D measurements. The described method also has several quantifiable advantages over the sphere-based approach [1]. First, the number of control points can be made as large as desired, whereas the number of control points in the sphere-based approach is limited. (The illustrated phantom has 10,830 control points compared to 792 in a phantom of similar size that used spheres[1]). Secondly, the present method is more accurate. If the maximum absolute difference in the positional displacement is used as a measure, the present method reduced it from over 10.00 mm before the correction to ~0.6 mm after the correction, a reduction by a factor of more than 15. By comparison, using the method described in [1], the reduction was about four fold from 4.3 mm before the correction to ~1.0 mm after the correction. A similar performance difference is obtained in the reduction in the mean errors of the positions of the control points between the two methods. Thirdly, the design of the phantom is extremely simple and flexible. In addition, the collection of the phantom MR images needed to map the geometric distortion is also simple.

The foregoing describes only one embodiment of the invention and modifications may be made thereto within the scope and spirit of the invention. For example, it will be apparent to those skilled in the art that by changing the grid dimensions and the width of the grid sheets, phantoms with any desired density of control points can be easily constructed. Further, the invention is not limited to MRI, and may be used in other imaging applications, e.g. calibrating CT scan machines.

The phantom need not comprise separate layers of thin-walled grids as shown in FIG. 2. It may be a three dimensional grid formed from rods with square or rectangular cross-section, or may comprise equally spaced parallel sheets with square or rectangular apertures that are aligned. Other possible designs for the phantom include
1. three sets of equally spaced parallel sheets with each set aligned along one of the orthogonal axes (with holes suitably cut through the sheets for water-filling the spaces between the sheets), and
2. three sets of square-shaped rods with each set aligned parallel with one of the three orthogonal axes.

As long as there are three orthogonal planes defined in a small neighborhood of each of the control points, the shape of the rest of the structure of the phantom is not so important.

TABLE 1

Summary of the statistical data ($\mu$, $\sigma$, max) of positional differences (absolute) in the measured coordinates of the control points compared between the three different data sets described in the text. The PSV sizes used were: PSV(xy) = 7 × 7 × 3 and PSV(z) = 3 × 3 × 5.

| Data set I | Data set II | Direction | $\mu$ (mm) | $\sigma$ | max (mm) |
|---|---|---|---|---|---|
| 1 | 2 | x | 0.06 | 0.06 | 0.53 |
|   |   | y | 0.05 | 0.04 | 0.40 |
|   |   | z | 0.06 | 0.05 | 0.48 |
|   |   | $\bar{r}$ | 0.11 | 0.06 | 0.70 |
| 1 | 3 |   | 0.05 | 0.05 | 0.52 |
|   |   |   | 0.04 | 0.04 | 0.40 |
|   |   |   | 0.05 | 0.04 | 0.40 |
|   |   |   | 0.10 | 0.06 | 0.61 |
| 2 | 3 |   | 0.05 | 0.05 | 0.53 |
|   |   |   | 0.04 | 0.04 | 0.37 |
|   |   |   | 0.05 | 0.04 | 0.54 |
|   |   |   | 0.10 | 0.06 | 0.60 |

TABLE 2

Summary of the statistical data ($\mu$, $\sigma$, max) of positional differences (absolute) in the measured coordinates of the control points obtained with different sizes of PSVs.

| Data set | PSV size (Set I) | PSV size (Set II) | Direction | $\mu$ (mm) | $\sigma$ | max (mm) |
|---|---|---|---|---|---|---|
| 1 | 7 × 7 × 3 PSV(xy) 3 × 3 × 5 PSV(z) | 9 × 9 × 4 PSV(xy) 5 × 5 × 7 PSV(z) | x y z $\bar{r}$ | 0.05 0.02 0.09 0.12 | 0.04 0.02 0.07 0.07 | 0.27 0.13 0.46 0.46 |
| 2 |   |   |   | 0.05 0.02 0.09 0.12 | 0.04 0.02 0.07 0.07 | 0.27 0.16 0.45 0.45 |
| 3 |   |   |   | 0.05 0.02 0.10 0.12 | 0.04 0.01 0.08 0.07 | 0.27 0.10 0.44 0.44 |

TABLE 3

Summary of the statistical data ($\mu$, $\sigma$, max) of positional differences (absolute) between the measured coordinates of the control points in the phantom images (uncorrected or corrected) and the corresponding coordinates measured directly from the physical dimensions of the phantom.

| Data set | Status | Direction | $\mu$ (mm) | $\sigma$ | max (mm) |
|---|---|---|---|---|---|
| 1 | uncorrected | x | 1.46 | 1.47 | 8.12 |
|   |   | y | 1.44 | 1.39 | 6.90 |

TABLE 3-continued

Summary of the statistical data (μ, σ, max) of positional differences (absolute) between the measured coordinates of the control points in the phantom images (uncorrected or corrected) and the corresponding coordinates measured directly from the physical dimensions of the phantom.

| Data set | Status | Direction | μ (mm) | σ | max (mm) |
|---|---|---|---|---|---|
|  |  | z | 1.36 | 1.35 | 9.50 |
|  |  | r̄ | 2.83 | 2.00 | 10.67 |
| 1 | Corrected |  | 0.08 | 0.07 | 0.53 |
|  |  |  | 0.09 | 0.07 | 0.52 |
|  |  |  | 0.07 | 0.07 | 0.58 |
|  |  |  | 0.17 | 0.08 | 0.60 |
| 2 | Uncorrected |  | 1.46 | 1.47 | 8.09 |
|  |  |  | 1.44 | 1.39 | 7.02 |
|  |  |  | 1.36 | 1.35 | 9.31 |
|  |  |  | 2.83 | 1.99 | 10.54 |
| 2 | Corrected |  | 0.09 | 0.08 | 0.60 |
|  |  |  | 0.10 | 0.08 | 0.60 |
|  |  |  | 0.10 | 0.08 | 0.56 |
|  |  |  | 0.20 | 0.09 | 0.64 |
| 3 | Uncorrected |  | 1.46 | 1.47 | 8.14 |
|  |  |  | 1.44 | 1.39 | 7.03 |
|  |  |  | 1.36 | 1.35 | 9.33 |
|  |  |  | 2.83 | 1.99 | 10.56 |
| 3 | Corrected |  | 0.08 | 0.07 | 0.58 |
|  |  |  | 0.11 | 0.09 | 0.58 |
|  |  |  | 0.11 | 0.10 | 0.50 |
|  |  |  | 0.21 | 0.10 | 0.68 |

REFERENCES

[1] Breeuwer M, Holden M, Zylka W. Detection and correction of geometric distortion in 3D MR images Proc SPIE 2001;4322:1110-1120

[2] Holden M, Breeuwer M, Mcleish K, Hawkes D J, Keevil S F, Hill D L G. Sources and correction of higher order geometrical distortion for serial MR brain imaging Proc SPIE 2001;4322:69-78

[3] Sonka M, Hlavac V, Boyle R. Image processing, analysis and machine vision International Thomson Publishing Inc. 1996

[4] Franke R. Scattered data interpolation: tests of some methods Mathematics of Computation 1982;38:181-200

The invention claimed is:

1. Apparatus for use in measuring distortion in imaging system, the apparatus comprising a three-dimensional structure having a plurality of boundary surface portions, the structure defining a plurality of control points thereon which are of constant spatial relationship to each other, each of the control points being definable by reference to three orthogonal planes, each of which is identifiable by reference to one or more of the boundary surface portions of the structure, wherein in an image of the apparatus produced by the imaging system, the position of each of said planes for each control point is determinable by detecting in the image an interfacial boundary between the respective boundary surface portion(s) and a medium surrounding the structure, wherein the control points are distributed uniformly over substantially the entire volume of the three-dimensional structure such that geometric distortion can be mapped for the entire volume with a single three dimensional image scan, wherein the structure comprises a plurality of spaced parallel planar grids, each grid having opposed planar boundary surface portions, wherein each planar grid comprises a plurality of spaced parallel first slat-like portions and a plurality of spaced parallel second slat-like portions orientated orthogonally to the first slat-like portions and intersecting therewith, each of the slat-like portions having opposed boundary surface portions orthogonal to the plane of the grid, wherein each control point is located on a boundary surface portion of a said planar grid at the intersection of a respective one of the first slat-like portions with a respective one of the second slat-like portions, and further wherein each control point is defined by reference to the intersection of:

(a) the plane of the boundary surface portion of the grid on which it is located, (b) a plane in the middle of the opposed boundary surface portions of the respective first slat-like portion, and (c) a plane in the middle of the opposed boundary surface portions of the respective second slat-like portion.

2. A method of determining geometric distortion in an imaging system, comprising the steps of:

(a) providing a three-dimensional structure having a plurality of boundary surface portions, the structure defining a plurality of control points thereon which are of constant spatial relationship to each other, each of the control points being definable by the intersection of three orthogonal planes, each of which is identifiable by reference to one or more of the boundary surface portions of the structure, and wherein the control points are distributed uniformly over substantially the entire volume of the three-dimensional structure, (b) creating an image of the structure using the imaging system with a single three dimensional image scan, (c) locating the positions of the control points of interest in the image by reference to their respective boundary surfaces, and (d) for each control point of interest, calculating the difference between the position of the control point in the image and the true position of the control point to thereby map geometric distortion for the entire volume;

wherein step (c) includes for each control point of interest:

detecting an interfacial boundary between each of the associated boundary surface portions and a medium surrounding the structure, determining the three orthogonal planes by reference to the detected boundary surfaces, and locating the image position of the control point as the intersection of the three determined orthogonal planes; and wherein the step of detecting an interfacial boundary comprises image edge detection using a derivative function.

3. A method as claimed in claim 2, wherein the derivative function is a Prewitt operator.

4. A method of determining geometric distortion in an imaging system, comprising the steps of:

(a) providing a three-dimensional structure having a plurality of boundary surface portions, the structure defining a plurality of control points thereon which are of constant spatial relationship to each other, each of the control points being definable by the intersection of three orthogonal planes, each of which is identifiable by reference to one or more of the boundary surface portions of the structure, and wherein the control points are distributed over substantially the entire volume of the three-dimensional structure, (b) creating an image of the structure using the imaging system with a single three dimensional image scan, (c) locating the positions of the control points of interest in the image, and (d) for each control point of interest, calculating the difference between the position of the control point in the image and the true position of the control point to thereby map geometric distortion for the entire volume, wherein step (c) includes the preliminary step of convoluting the image with a mask to assist the identification of voxels at the control points.

5. A method of determining geometric distortion in an imaging system, comprising the steps of:

(a) providing a three-dimensional structure having a plurality of boundary surface portions, the structure defining a plurality of control points thereon which are of constant spatial relationship to each other, each of the control points being definable by the intersection of three orthogonal planes, each of which is identifiable by reference to one or more of the boundary surface portions of the structure, and wherein the control points are distributed over substantially the entire volume of the three-dimensional structure, (b) creating an image of the structure using the imaging system with a single three dimensional image scan, (c) locating the positions of the control points of interest in the image, and (d) for each control point of interest, calculating the difference between the position of the control point in the image and the true position of the control point to thereby map geometric distortion for the entire volume, wherein the structure comprises a plurality of spaced parallel planar grids, each grid having opposed planar boundary surface portions, and each grid comprising a plurality of spaced parallel first slat-like portions and a plurality of spaced parallel second slat-like portions orientated orthogonally to the first slat-like portions and intersecting therewith, each of the slat-like portions having opposed boundary surface portions orthogonal to the plane of the grid, and wherein each control point is located on a boundary surface portion of a said planar grid at the intersection of a first slat-like portion with a second slat-like portion, and further wherein each control point is defined by reference to the intersection of:

(i) the plane of the boundary surface portion of the grid on which it is located, (ii) a plane in the middle of the opposed boundary surface portions of the first slat-like portion, and (iii) a plane in the middle of the opposed boundary surface portions of the second slat-like portion.

6. Apparatus for use in measuring distortion in imaging system, the apparatus comprising a three-dimensional structure comprising a plurality of spaced parallel planar grid plates, each grid plate having a plurality of planar boundary surface portions in three orthogonal planes, the structure defining a plurality of control points thereon which are of constant spatial relationship to each other, each of the control points being definable by reference to three orthogonal planes each of which is identifiable by reference to a respective one or more of the planar boundary surface portions of the structure, wherein in an image of the apparatus produced by the imaging system, the position of each of said planes for each control point is determinable by detecting in the image an intefacial boundary between the respective boundary surface portions and a medium surrounding the structure, and wherein the control points are distributed uniformly over substantially the entire volume of the three-dimensional structure such that geometric distortion can be mapped for the entire volume with a single three dimensional image scan.

7. Apparatus as claimed in claim 6, wherein each planar grid plate comprises a plurality of spaced parallel first slat-like portions and a plurality of spaced parallel second slat-like portions orientated orthogonally to the first slat-like portions and intersecting therewith, each of the slat-like portions having opposed boundary surface portions orthogonal to the plane of the grid plate.

8. A method of determining geometric distortion in an imaging system, comprising the steps of:

(a) providing a three-dimensional structure comprising a plurality of spaced parallel planar grid plates, each grid plate having a plurality of planar boundary surface portions, the structure defining a plurality of control points thereon which are of constant spatial relationship to each other, each of the control points being definable by the intersection of three orthogonal planes each of which is identifiable by reference to a respective one or more of the boundary surface portions of the structure, and wherein the control points are distributed uniformly over substantially the entire volume of the three-dimensional structure, (b) creating an image of the structure using the imaging system with a single three dimensional image scan, (c) locating the positions of the control points of interest in the image, by reference to the respective boundary surfaces, wherein the locating step includes for each control point of interest:

detecting an interfacial boundary between each of the respective boundary surface portions and a medium surrounding the structure, determining the three orthogonal planes by reference to the detected interfacial boundary, and locating the image position of the control point as the intersection of the three determined orthogonal planes, and (d) for each control point of interest, calculating the difference between the position of the control point in the image and the true position of the control point to thereby map geometric distortion for the entire volume.

9. A method as claimed in claim 8, wherein comprises a plurality of spaced parallel first slat-like portions and a plurality of spaced parallel second slat-like portions orientated orthogonally to the first slat-like portions and intersecting therewith, each of the slat-like portions having opposed boundary surface portions orthogonal to the plane of the grid plate.

10. A method as claimed in claim 8, further comprising the step of using the calculated differences between the image and true positions of the control points to modify the imaging system so as to compensate for geometric distortion.

11. A method as claimed in claim 10, wherein images created by the imaging system are corrected for distortion by piecewise interpolation.

12. A method as claimed in claim 8, wherein the imaging system is a magnetic resonance imaging system.

13. A method as claimed in claim 8 wherein at least steps (c) and (d) are automated.

* * * * *